(12) United States Patent
Sengodan et al.

(10) Patent No.: US 12,287,434 B2
(45) Date of Patent: Apr. 29, 2025

(54) PDU SENSOR USING MULTI OPTICAL PRISM

(71) Applicant: GOODRICH CORPORATION, Charlotte, NC (US)

(72) Inventors: Rajkumar Sengodan, Namakkal (IN); Thirunavukkarasu Ramalingam, Bangalore (IN)

(73) Assignee: GOODRICH CORPORATION, Charlotte, NC (US)

( * ) Notice: Subject to any disclaimer, the term of this patent is extended or adjusted under 35 U.S.C. 154(b) by 398 days.

(21) Appl. No.: 17/851,852

(22) Filed: Jun. 28, 2022

(65) Prior Publication Data

US 2023/0194686 A1 Jun. 22, 2023

(30) Foreign Application Priority Data

Dec. 16, 2021 (IN) ............................. 202141058762

(51) Int. Cl.
| | | |
|---|---|---|
| *G01S 7/00* | (2006.01) | |
| *G01R 19/165* | (2006.01) | |
| *G01S 7/481* | (2006.01) | |
| *G01S 7/497* | (2006.01) | |
| *G01S 17/04* | (2020.01) | |

(52) U.S. Cl.
CPC ........ *G01S 7/497* (2013.01); *G01R 19/16576* (2013.01); *G01S 7/4813* (2013.01); *G01S 7/4816* (2013.01); *G01S 17/04* (2020.01)

(58) Field of Classification Search
CPC ...................................................... G01V 8/12
See application file for complete search history.

(56) References Cited

U.S. PATENT DOCUMENTS

| | | | |
|---|---|---|---|
| 6,835,923 B2 | 12/2004 | Hamalainen et al. | |
| 7,199,543 B1 | 4/2007 | Hettwer | |
| 7,673,738 B2 | 3/2010 | McConnell | |
| 10,583,988 B1 | 3/2020 | Zeidner et al. | |
| 10,604,228 B2 | 3/2020 | Harms et al. | |
| 2013/0153755 A1* | 6/2013 | Pikkujamsa | H03K 17/941 250/221 |

FOREIGN PATENT DOCUMENTS

JP    S59145982    8/1984

OTHER PUBLICATIONS

European Patent Office, European Search Report dated Apr. 19, 2023 in Application No. 22211807.7.
European Patent Office, European Office Action dated Oct. 23, 2024 in Application No. 22211807.7.

\* cited by examiner

*Primary Examiner* — Dani Fox
(74) *Attorney, Agent, or Firm* — SNELL & WILMER L.L.P.

(57) ABSTRACT

A sensor in an aircraft cargo handling system may comprise a housing, an infrared light emitter, an infrared light photoreceptor, and a microprism. The sensor may be configured to detect an object in proximity to the sensor using electromagnetic waves and voltage measurements. The sensor may include a microcontroller configured to read the voltage measurements associated with infrared electromagnetic waves, compare the voltage measurements to a threshold voltage, and determine the functional condition of the sensor based on the comparison.

20 Claims, 10 Drawing Sheets

PDU SENSOR USING MULTI OPTICAL PRISM

CROSS-REFERENCE TO RELATED APPLICATIONS

This application claims priority to, and the benefit of, India Patent Application No. 202141058762, filed Dec. 16, 2021 (DAS Code E11B) and titled "PDU SENSOR USING MULTI OPTICAL PRISM," which is incorporated by reference herein in its entirety for all purposes.

FIELD

The present disclosure relates to a sensor, and more specifically, to a PDU infrared sensor having a multi optical prism.

BACKGROUND

Many aircraft have at least one cargo bay designed to receive cargo. These aircraft cargo bays include powered cargo loading systems comprising a plurality of powered drive units (PDUs) to assist the loading of cargo and equipment into the aircraft. A train and/or series of PDUs may serve to assist pallets and containers of desired dimensions to travel down from fore to aft and from aft to fore of an aircraft (e.g., down the body of the aircraft), typically to the main and lower cargo compartments of the aircraft. Conventionally, PDUs are equipped with Built-in Test Equipment (BITE) to monitor and record the fault in the control assembly of the PDU. The PDU continuously monitors itself for various conditions and reports its functional status to the Cargo Maintenance Display Unit (CMDU). Testing the functional condition of an infrared (IR) sensor of a PDU is especially difficult after the sensors are installed in the control assembly.

SUMMARY

An infrared sensor for use in a PDU of a cargo loading system is disclosed herein. In accordance with various embodiments, the sensor may comprise a housing, an infrared light emitter, and a microprism. In various embodiments, the housing may comprise a first housing orifice located distal to a second housing orifice. In various embodiments, the housing may comprise a slit mount defining a slit mount cavity. In various embodiments, the housing may comprise a rim defining a first infrared prism cavity and a second infrared prism cavity. In various embodiments, the slit mount may be disposed between the first infrared prism cavity and the second infrared prism cavity. In various embodiments, the infrared light transmitter may be located proximate the first infrared prism cavity of the housing. In various embodiments, the infrared light transmitter may be configured to emit a first electromagnetic wave. In various embodiments, the first electromagnetic wave may be infrared light.

In various embodiments, the microprism may be disposed within the slit mount defining the slit mount cavity. In various embodiments, the microprism may be an acrylic sheet. In various embodiments, the microprism may be configured to refract the first electromagnetic wave emitted from the infrared light emitter. In various embodiments, the first electromagnetic wave may traverse the first infrared prism cavity to the second infrared prism cavity via the microprism.

In various embodiments, the sensor may further comprise an infrared light photoreceptor. In various embodiments, the infrared light photoreceptor may be located proximate the second infrared prism cavity of the housing. In various embodiments, the refracted first electromagnetic wave may be received by the infrared light photoreceptor. In various embodiments, the infrared light photoreceptor may be configured to convert the first electromagnetic wave received by the infrared light photoreceptor into a first voltage measurement.

In various embodiments, the sensor may further comprise a microcontroller. The microcontroller may be configured to set a predetermined threshold voltage value. In various embodiments, the microcontroller may be configured to command the infrared light emitter to emit the first electromagnetic wave. In various embodiments, the microcontroller may be configured to command the infrared light photoreceptor to receive the first electromagnetic wave, convert the first electromagnetic wave into the first voltage measurement, and send the first voltage measurement to the microcontroller. In various embodiments, the microcontroller may be further configured to receive the first voltage measurement from the infrared light photoreceptor, read the first voltage measurement, compare the first voltage measurement to the threshold voltage value set by the microcontroller, and determine sensor failure if the first voltage measurement is below the threshold value.

In various embodiments, the sensor may further comprise a first infrared prism lens disposed within the first infrared prism cavity. In various embodiments, the sensor may comprise a second infrared prism lens disposed within the second infrared prism cavity. In various embodiments, the first infrared prism lens and the second infrared prism lens may be configured to permit electromagnetic waves to pass therethrough. In various embodiments, the first infrared prism lens may be larger than the second infrared prism lens. In various embodiments, the microprism, the first infrared prism lens, and the second infrared prism lens may be molded in the housing.

In various embodiments, the infrared light emitter may be configured to emit a second electromagnetic wave. The second electromagnetic wave may traverse the first infrared prism cavity and pass out of the sensor housing through the first infrared prism lens. In various embodiments, the second electromagnetic wave may reflect off an object and back onto the sensor if an object is in proximity to the sensor. In various embodiments, the reflected second electromagnetic wave may pass through the second infrared prism lens. In various embodiments, the reflected second electromagnetic wave may traverse the second infrared prism cavity of the housing. In various embodiments, the reflected second electromagnetic wave may be received by the infrared light photoreceptor. In various embodiments, the infrared light photoreceptor may be configured to convert the second electromagnetic wave received by the infrared light photoreceptor into a second voltage measurement. In various embodiments, the second voltage measurement may be a variable value.

In various embodiments, the microprism may comprise an apex angle α. In various embodiments, the microprism may comprise a first face and a second face. In various embodiments, the first electromagnetic wave may be configured to enter the microprism through the first face. In various embodiments, the first electromagnetic wave may be configured to exit the microprism through the second face.

In various embodiments, the first face may be configured to refract the first electromagnetic wave at a first refraction region. In various embodiments, the first refraction region may comprise an index of refraction $\theta_0$. In various embodiments, the microprism may be further configured to refract the first electromagnetic wave at a second refraction region located between the first face and the second face. In various embodiments, the second refraction region may comprise an index of refraction $\theta_1$. In various embodiments, the second face may be configured to refract the first electromagnetic wave at a third refraction region. In various embodiments, the third refraction region may comprise an index of refraction $\theta_2$. In various embodiments, the first electromagnetic wave may comprise an angle of refraction $\theta'_0$ at the second refraction region and an angle of refraction $\theta'_1$ at the third refraction region.

A method for testing a sensor is also disclosed herein. In accordance with various embodiments, the method may comprise setting a threshold voltage value by a microcontroller of the sensor. In various embodiments, the sensor may further comprise a housing, an infrared light emitter, an infrared light photoreceptor, a microprism, and a microcontroller. In various embodiments, the housing may comprise a slit mount defining a slit mount cavity. In various embodiments, the housing may comprise a rim defining a first infrared prism cavity and a second infrared prism cavity. In various embodiments, the slit mount may be disposed between the first infrared prism cavity and the second infrared prism cavity. The slit mount may be oriented between the first infrared prism cavity and the second infrared prism cavity.

In various embodiments, the infrared light emitter may be located proximate the first infrared prism cavity of the housing. In various embodiments, the infrared light photoreceptor may be located proximate the second infrared prism cavity of the housing. In various embodiments, the microprism may be disposed within the slit mount defining the slit mount cavity.

In various embodiments, the method may further comprise commanding, by the microcontroller, the infrared light emitter to emit a first electromagnetic wave through the first infrared prism cavity of the sensor housing. In various embodiments, the first electromagnetic wave may traverse the first infrared prism cavity to the second infrared prism cavity via the microprism. The microprism may be configured to refract the first electromagnetic wave emitted from the infrared light emitter. In various embodiments, the method may further comprise commanding, by the microcontroller, the infrared light photoreceptor to receive the refracted first electromagnetic wave, convert the first electromagnetic wave into a first voltage measurement, and send the first voltage measurement to the microcontroller.

In various embodiments, the method may further comprise reading, by the microcontroller, the first voltage measurement. In various embodiments, the method may comprise comparing, by the microcontroller, the first voltage measurement to the threshold voltage value set by the microcontroller. In various embodiments, the method may comprise determining, by the microcontroller, sensor failure if the first voltage measurement is below the threshold voltage value.

In various embodiments, the method may further comprise commanding, by the microcontroller, the infrared light emitter to emit a second electromagnetic wave through the first infrared prism cavity of the sensor housing. In various embodiments, the sensor housing may further comprise a first infrared prism lens disposed within the first infrared prism cavity. In various embodiments, the housing may comprise a second infrared prism lens disposed within the second infrared prism cavity.

In various embodiments, the first infrared prism lens and the second infrared prism lens may be configured to permit infrared light to pass therethrough. In various embodiments, the second electromagnetic wave emitted by the infrared light emitter may traverse the first infrared prism cavity and pass out of the sensor housing through the first infrared prism lens. In various embodiments, the second electromagnetic wave may reflect back onto the sensor. In various embodiments, the reflected second electromagnetic wave may pass through the second infrared prism lens. In various embodiments, the second electromagnetic wave may traverse the second infrared prism cavity of the housing. In various embodiments, the method may further comprise commanding, by the microcontroller, the infrared light photoreceptor to receive the reflected second electromagnetic wave, convert the second electromagnetic wave into a second voltage measurement, and send the second voltage measurement to the microcontroller.

In various embodiments, the method may further comprise reading, by the microcontroller, the second voltage measurement. In various embodiments, the method may further comprise subtracting, by the microcontroller, the first voltage measurement of the first electromagnetic wave from the second voltage measurement of the second electromagnetic wave to form a third voltage measurement. In various embodiments, the method may further comprise comparing, by the microcontroller, the third voltage measurement to the threshold voltage value. In various embodiments, the method may comprise determining, by the microcontroller, object proximity to the sensor if the third voltage measurement is greater than the threshold voltage value.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration. While these exemplary embodiments are described in sufficient detail to enable those skilled in the art to practice the disclosure, it should be understood that other embodiments may be realized and that logical changes and adaptations in design and construction may be made in accordance with this disclosure and the teachings herein. Thus, the detailed description herein is presented for purposes of illustration only and not of limitation. The scope of the disclosure is defined by the appended claims. For example, the steps recited in any of the method or process descriptions may be executed in any order and are not necessarily limited to the order presented. Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact.

Figure 1:
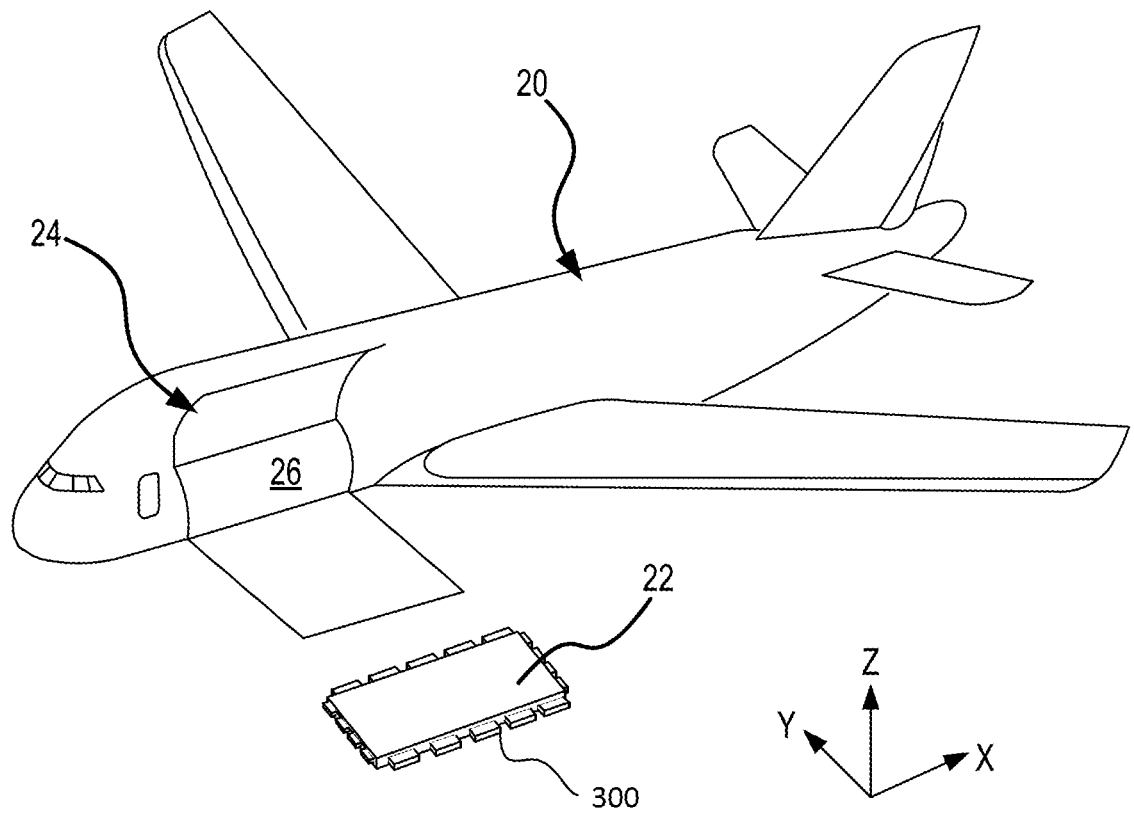
FIG. 1 illustrates an aircraft being loaded with cargo, in accordance with various embodiments.
Figure 2:
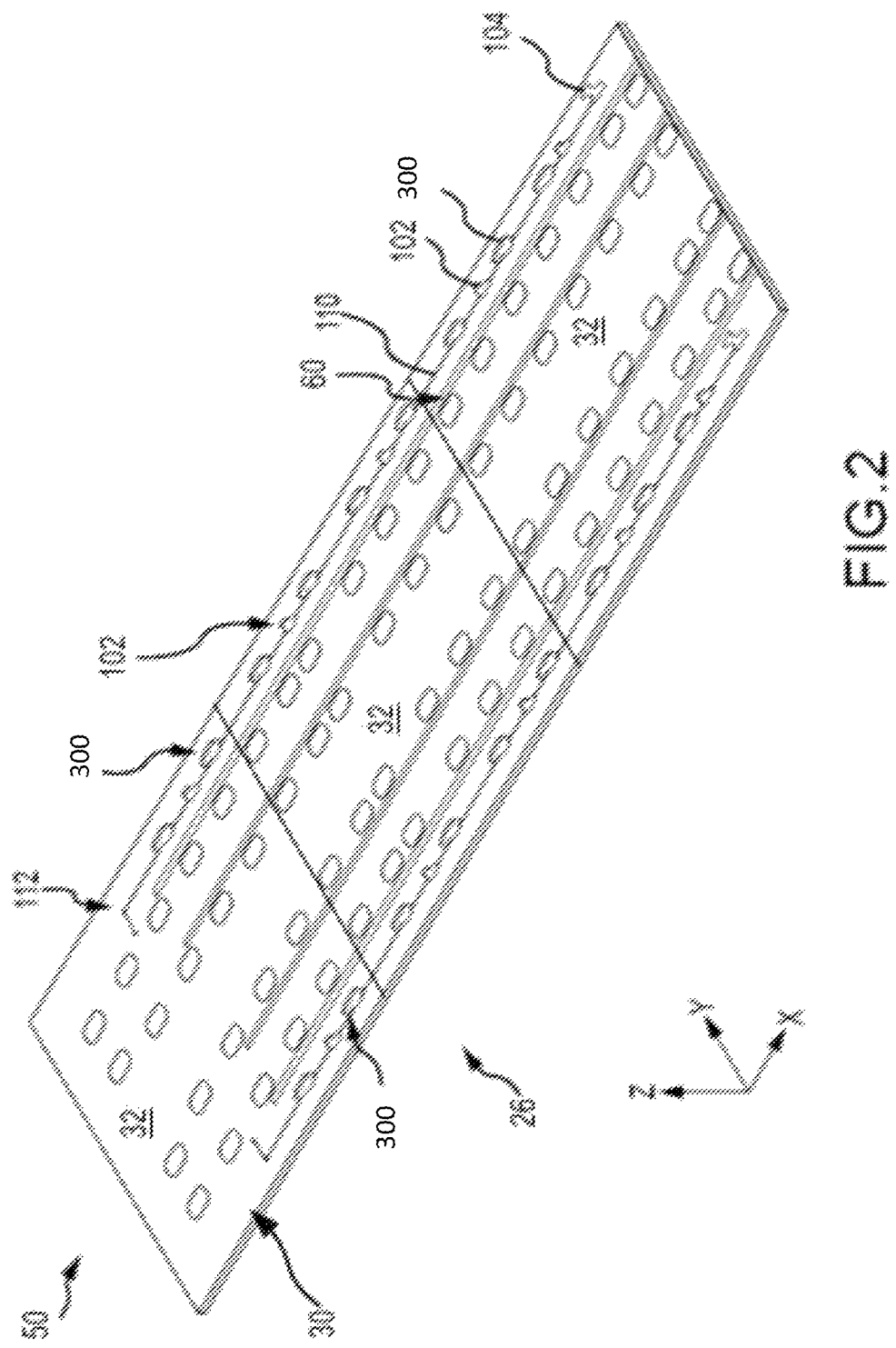
FIG. 2 illustrates a surface of an aircraft cargo deck having a PDU base, in accordance with various embodiments.

FIG. 1 illustrates an aircraft 20 with cargo 22 being loadable through a loading door 24 of the aircraft 20. Cargo 22 (e.g., a unit load device (ULD), pallet, or the like) may be loaded through loading door 24 and onto a cargo deck 26. FIG. 2 illustrates cargo deck 26. Cargo deck 26 includes a cargo deck floor 30, which may be formed by one or more panels 32 that are coupled to various structural components of aircraft 20 (e.g., to beams, floors, etc.).

With continued reference to FIG. 2, in accordance with various embodiments, the cargo deck 26 includes a cargo restraint system 50. Stated differently, cargo restraint system 50 may be installed along cargo deck 26. Cargo deck 26 may also include a cargo loading system 60 comprising a plurality of freely rotating conveyance rollers and/or power drive units (PDUs) mounted in the cargo deck 26 to define the conveyance plane. Cargo loaded onto the aircraft cargo deck 26 can be moved throughout the cargo deck 26 using the cargo loading system 60.

Cargo restraint system 50 may be used to restrain cargo (e.g., unit load devices (ULDs)) within/relative to the cargo deck 26. The cargo restraint system 50 may include a plurality of first restraints 102 and one or more secondary restraints 104. The restraint system 50 may include an actuation assembly 110. A control region 112 of actuation assembly 110 may be located, for example, proximate loading door 24, with momentary reference to FIG. 1, a forward end of the aircraft, and/or at any other location that may be readily accessible to crew responsible for loading cargo into cargo deck 26. In various embodiments, a PDU may comprise a PDU sensor 300 that may sense the presence of cargo 22 on the cargo deck 26.

Figure 3A:
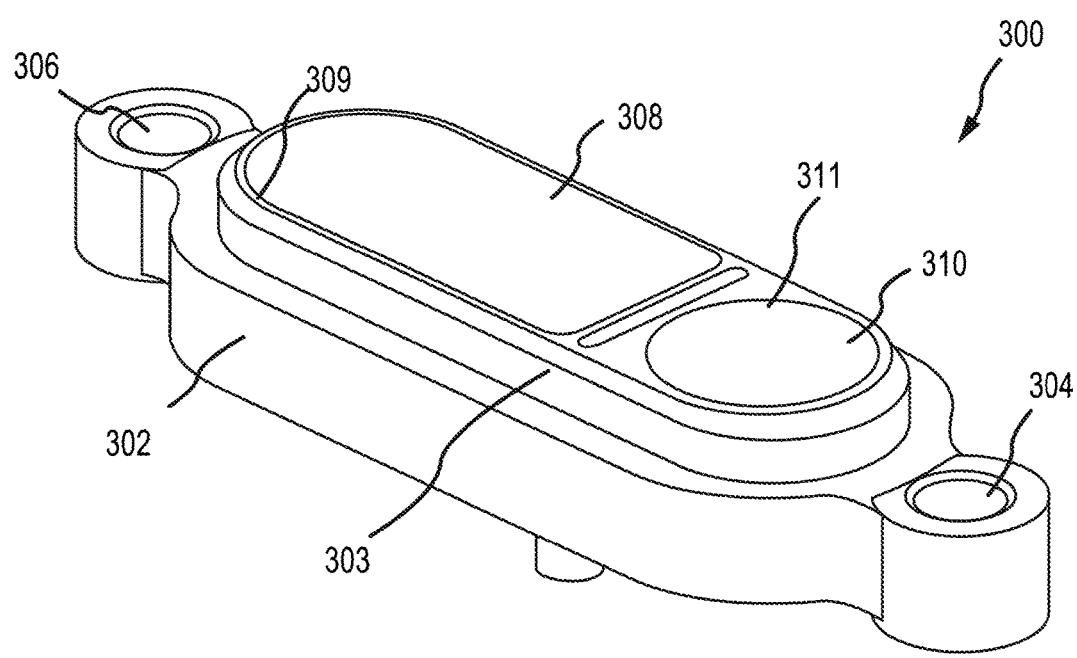
FIG. 3A illustrates an offset view of a PDU infrared sensor, in accordance with various embodiments.
Figure 3A:
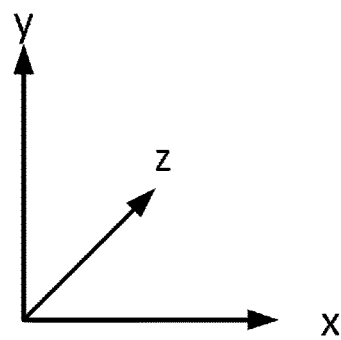

FIG. 3A illustrates a PDU sensor 300. As shown, the sensor 300 may include a housing 302 having a rim 303. In various embodiments, the rim 303 may define first infrared prism cavity 309 and a second infrared prism cavity 311. The first infrared prism cavity 309 and the second infrared prism cavity 311 may extend completely through the housing 302. In various embodiments, the first infrared prism cavity 309 and the second infrared prism cavity 311 may extend through a portion of the housing 302. In various embodiments, the housing 302 may comprise a first housing orifice 304 located distal to a second housing orifice 306. The orifices 304, 306 may be configured to secure the sensor 300 to any component of the cargo deck 26 (e.g., the panels 32, the cargo loading system 60, etc.).

Figure 3B:
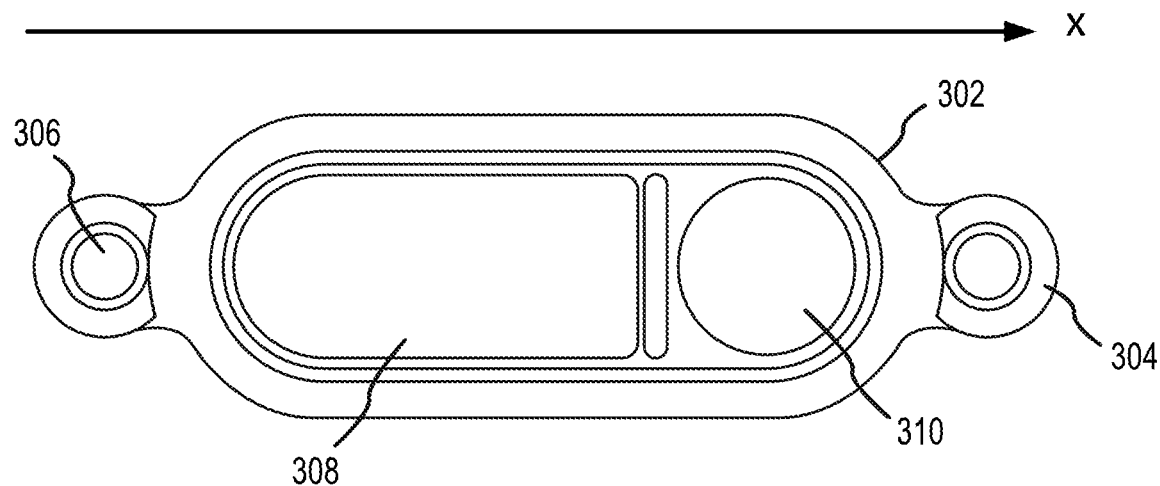
FIG. 3B illustrates a topside view of the PDU infrared sensor, in accordance with various embodiments.
Figure 3C:
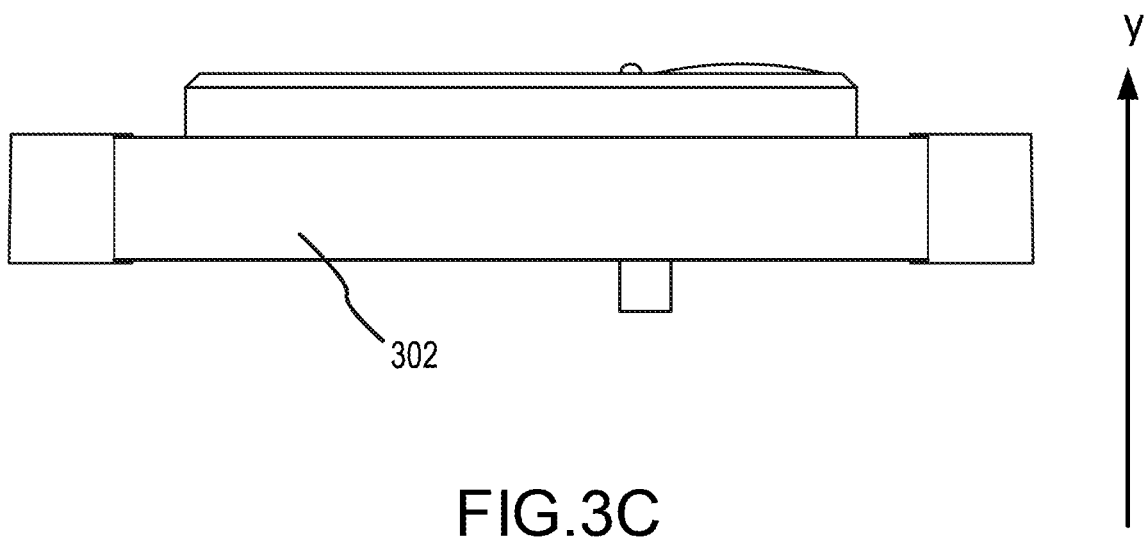
FIG. 3C illustrates a side view of the PDU infrared sensor, in accordance with various embodiments.

In continued reference to FIG. 3A and in further reference to FIGS. 3B and 3C, in various embodiments and as shown, the housing 302 may further comprise a first infrared prism lens 308 disposed within the first infrared prism cavity 309. In various embodiments, the housing 302 may further comprise a second infrared prism lens 310 disposed within the second infrared prism cavity 311. In various embodiments, the first infrared prism lens 308 and the second infrared prism lens 310 may be configured to permit electromagnetic waves, visible light, ultraviolet light, or the like, to pass therethrough. In various embodiments, the first infrared prism lens 308 and the second infrared prism lens 310 may be configured to permit infrared light to pass therethrough.

In various embodiments, the housing 302 may comprise any suitable metal, composite, and/or plastic material, including polystyrene, acrylic, polycarbonate, polypropylene, polyethylene terephthalate, high-density polyethylene, polyvinyl chloride, fiberglass, and the like. In various embodiments, the first infrared prism lens 308 and the second infrared prism lens 310 may comprise any suitable microstructure prism sheet for diffusing light, including polycarbonate, acrylic, polypropylene, polystyrene, and the like.

In various embodiments, the first infrared prism lens 308 and the second infrared prism lens 310 may be cut into the desired dimensions of the housing 302 and disposed within the first infrared prism cavity 309 and the second infrared prism cavity 311, respectively. In various embodiments, as shown in FIGS. 3B-3C, the first infrared prism lens 308 and the second infrared prism lens 310 may be disposed along the y-axis of the first infrared prism cavity 309 and the second infrared prism cavity 311, respectively. In various embodiments, the first infrared prism lens 308 and the second infrared prism lens 310 may be molded into the housing 302. In various embodiments, it may be advantageous for the first infrared prism lens 308 to be larger than the second infrared prism lens 310 to allow more electromagnetic waves to pass through the first infrared prism lens 308.

Figure 4:
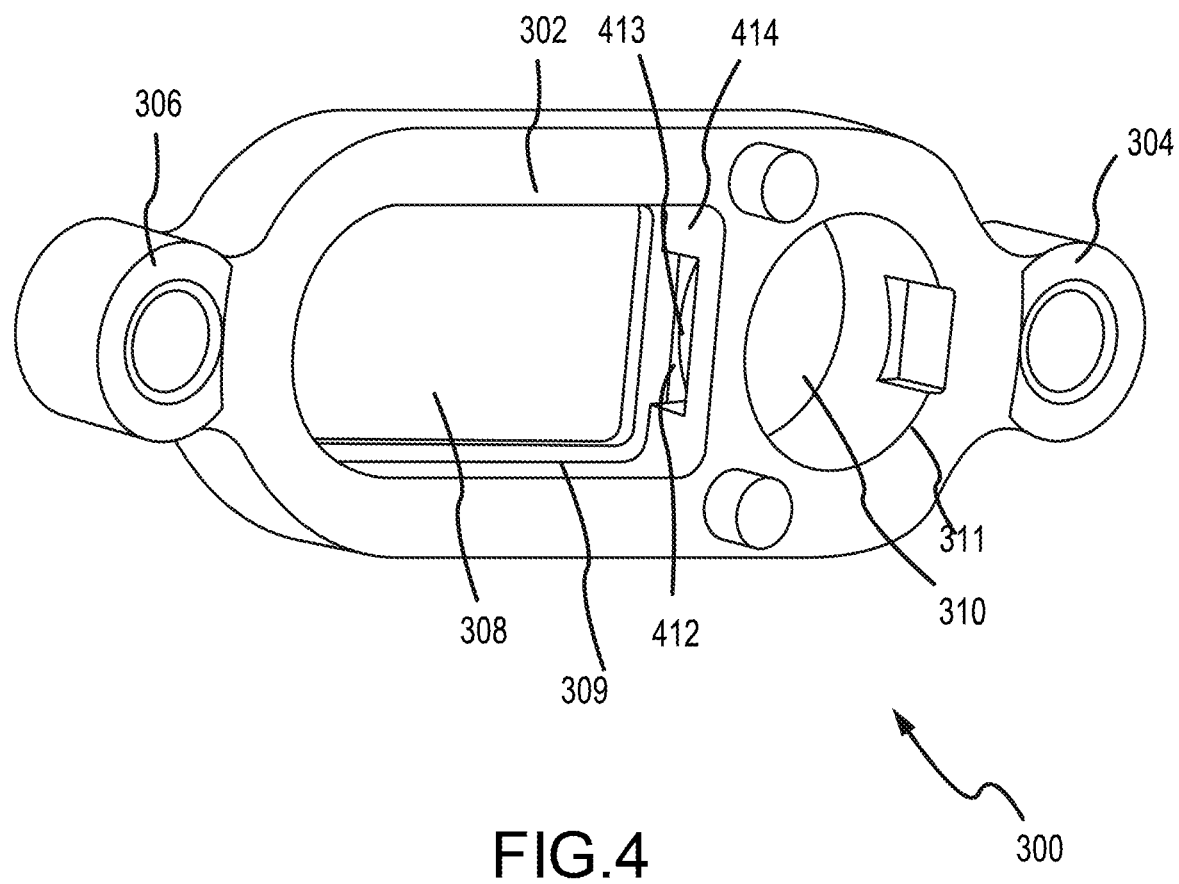
FIG. 4 illustrates a bottom view of the PDU infrared sensor, in accordance with various embodiments.

Referring now to FIG. 4, a bottom view of the sensor 300 is illustrated. As shown, for example, the housing 302 further comprises a slit mount 414 defining a slit mount cavity 412. In various embodiments, the slit mount 414 may be disposed between the first infrared prism cavity 309 and the second infrared prism cavity 311. In various embodiments, the slit mount 414 may be in a substantially perpendicular or substantially non-perpendicular orientation (e.g., substantially between 22.5° to 90° to 160°) between the first infrared prism cavity 309 and the second infrared prism cavity 311. In various embodiments, the housing 302 may define the slit mount 414. The slit mount 414 may comprise the same material as the housing 302, or any other plastic, metal, and/or composite material suitable for retaining a microprism 413.

Figure 5A:
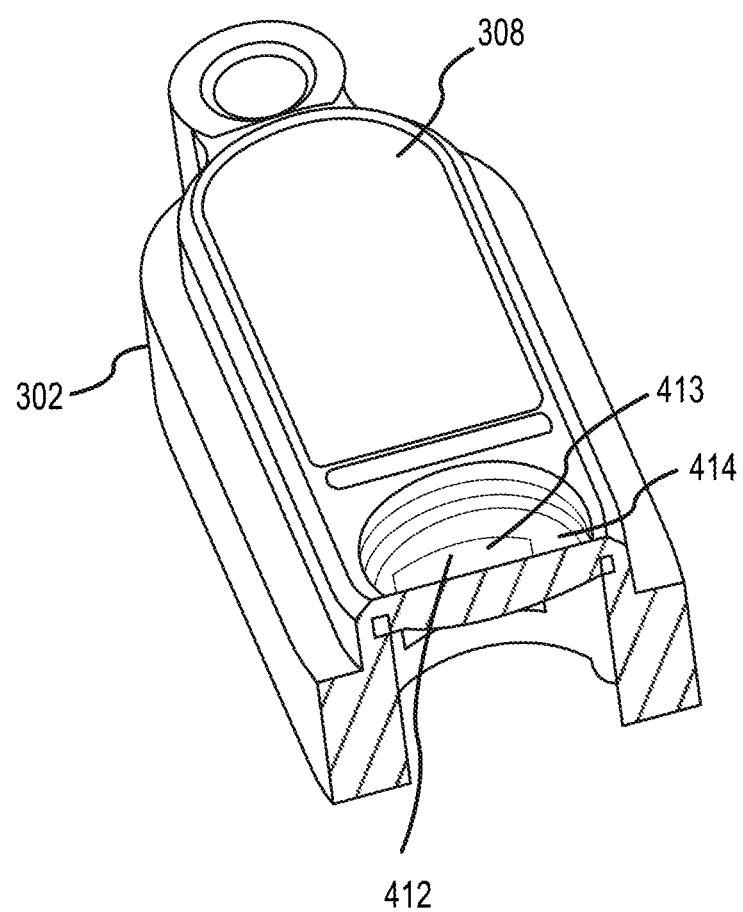
FIG. 5A illustrates a cross-sectional offset view of the PDU infrared sensor, in accordance with various embodiments.
Figure 5B:
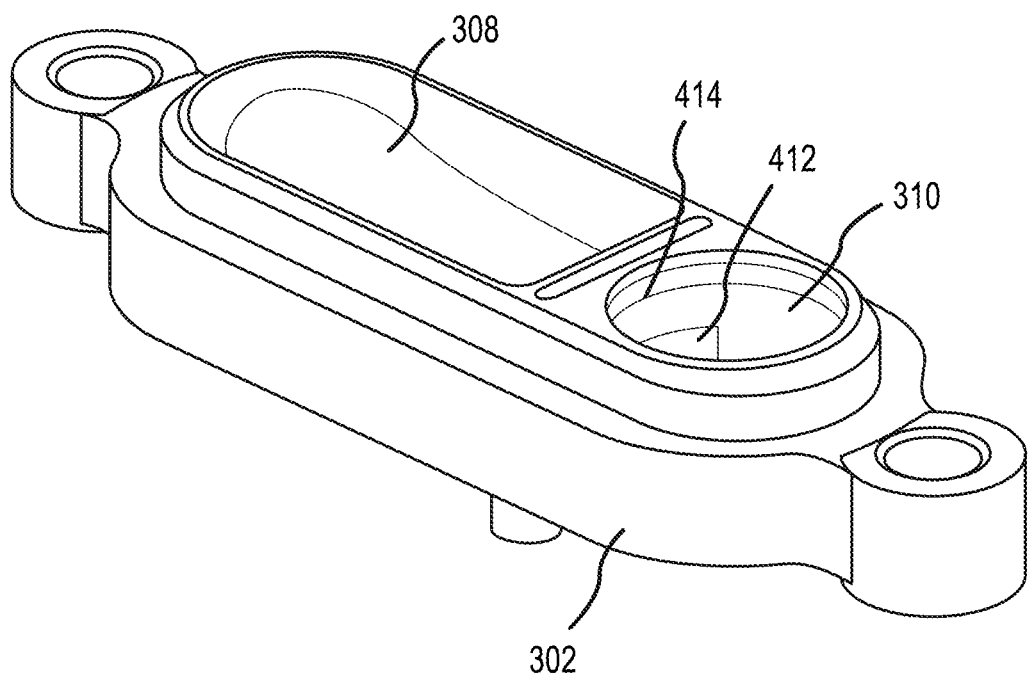
FIG. 5B illustrates another offset view of the PDU infrared sensor, in accordance with various embodiments.

Referring now to FIG. 5A, a cross-section view of the sensor housing 302 is illustrated. In various embodiments, and as shown, a microprism 413 may be disposed within the slit mount cavity 412. The slit mount 414 defining the slit mount cavity 412 may be configured to fully enclose the microprism 413. In various embodiments, the slit mount 414 defining the slit mount cavity 412 may be configured to surround a portion of the microprism 413. In various embodiments, the microprism 413 may be configured to refract electromagnetic waves. In various embodiments, and in further reference to FIGS. 5B and 5C, the microprism 413 may be configured to allow electromagnetic waves to traverse from the first infrared prism cavity 309 to the second infrared prism cavity 311 via the microprism 413.

The microprism 413 may comprise any suitable microstructure prism sheet for diffusing light, including polycarbonate, acrylic, glass polypropylene, polystyrene, and the like. In various embodiments, the microprism 413 may comprise acrylic sheet having a glaze finish. In various embodiments, the microprism 413 may comprise a thickness ranging from 0.04 inches, or approximately 1 millimeter, to 0.2 inches, or approximately 5 millimeters. In various embodiments, the microprism 413 may comprise a height of 0.040 inches, or 1 millimeter, and a thickness of 0.070 inches, or 1.78 millimeters.

Figure 7:
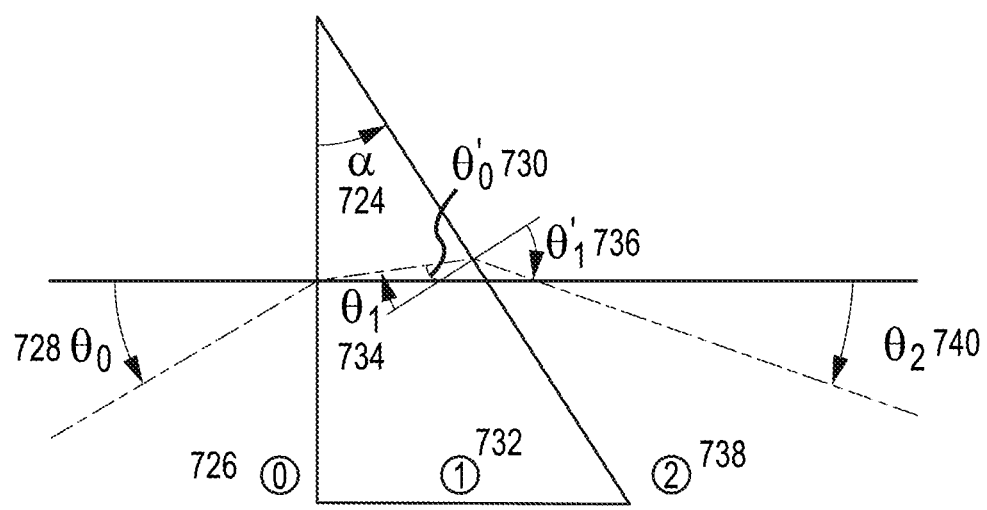
FIG. 7 illustrates a ray trace through a prism, including indices of refraction and the ray's angle after refraction, in accordance with various embodiments.

In various embodiments, and in further reference to FIG. 7, the microprism 413 may be cut into a dimension to comprise an apex angle α 724. In various embodiments, apex angle α 724 may be chosen to refract light traversing through microprism 413 at predetermined angles. For example, the microprism 413 may comprise a first face 517 facing the first infrared prism cavity 309 and a second face 519 facing the second infrared prism cavity 311. The first face 517 may be substantially planar and the second face 519 may be substantially concave. In various embodiments, the first electromagnetic wave 618 may be configured to enter the microprism 413 through the first face 517 and exit the microprism 413 through the second face 519. The faces 517, 519 of the microprism 413 may be cut into a desired thickness to ensure that light traversing through the microprism 413 is refracted at desired angles.

In various embodiments, the first face 517 may be configured to refract the first electromagnetic wave 618 at a first refraction region 726. The first refraction region 726 may be the area embodying the first infrared prism cavity 309. In various embodiments, the first refraction region 726 may comprise an index of refraction $\theta_0$ 728. In various embodiments, the microprism 413 may be further configured to refract the first electromagnetic wave 618 at a second refraction region 732. The second refraction region 732 may comprise the area of the microprism 413 between the first face 517 and the second face 519.

In various embodiments, the second refraction region 732 may comprise an index of refraction $\theta_1$ 734. In various embodiments, the second face 519 is configured to refract the first electromagnetic wave 618 at a third refraction region 738. The third refraction region 738 may be the area embodying the second infrared prism cavity 311. In various embodiments, the third refraction region 738 may have an index of refraction $\theta_2$ 740. In various embodiments, the first electromagnetic wave 618 may comprise angles of refraction as it traverses through the microprism 413. For example, the first electromagnetic wave 618 may comprise an angle of refraction $\theta'_0$ 730 at the second refraction region 732 and an angle of refraction $\theta'_1$ 736 at the third refraction region 738.

Figure 5C:
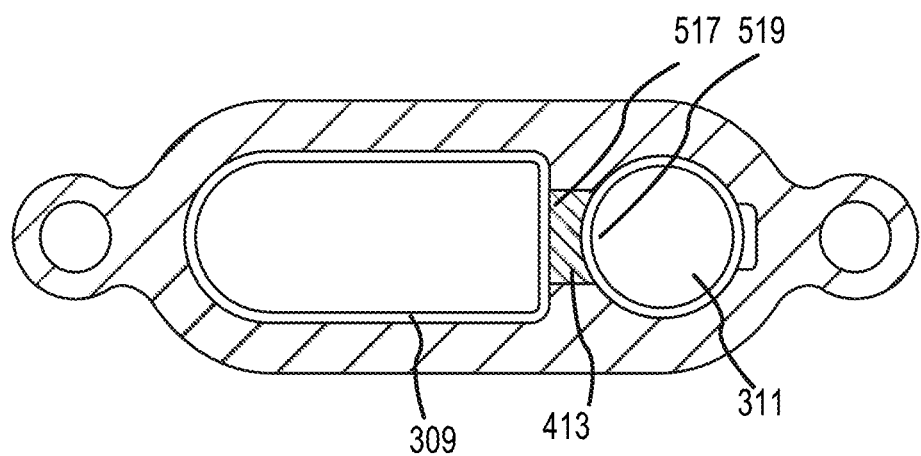
FIG. 5C illustrates a cross-sectional bottom view of the PDU infrared sensor, in accordance with various embodiments.
Figure 6A:
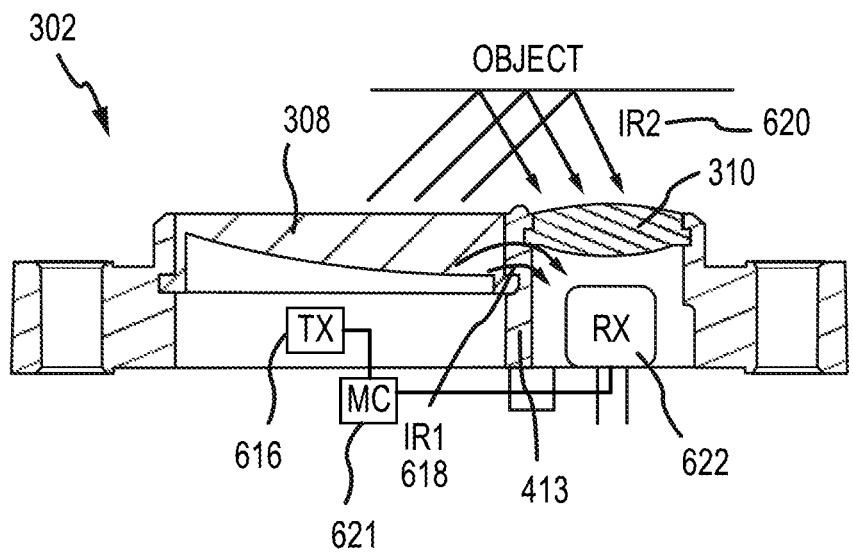
FIG. 6A illustrates a cross-sectional side view of the PDU infrared sensor, including the direction of infrared light through the sensor housing, in accordance with various embodiments.
Figure 6B:
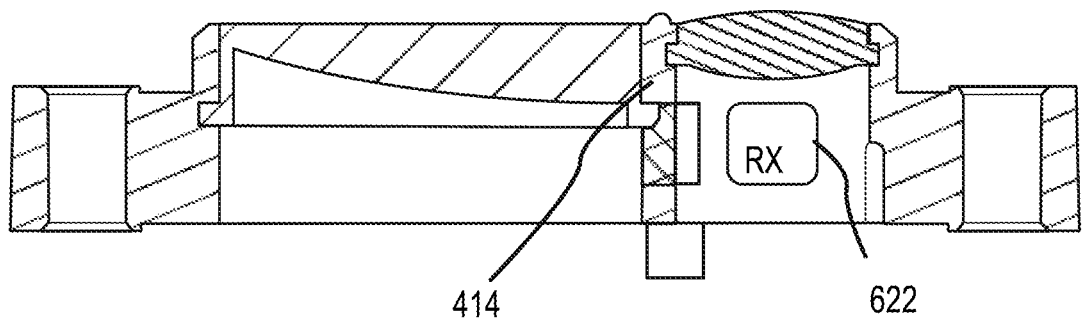
FIG. 6B illustrates a cross-sectional side view of the PDU infrared sensor, in accordance with various embodiments.
Figure 8:
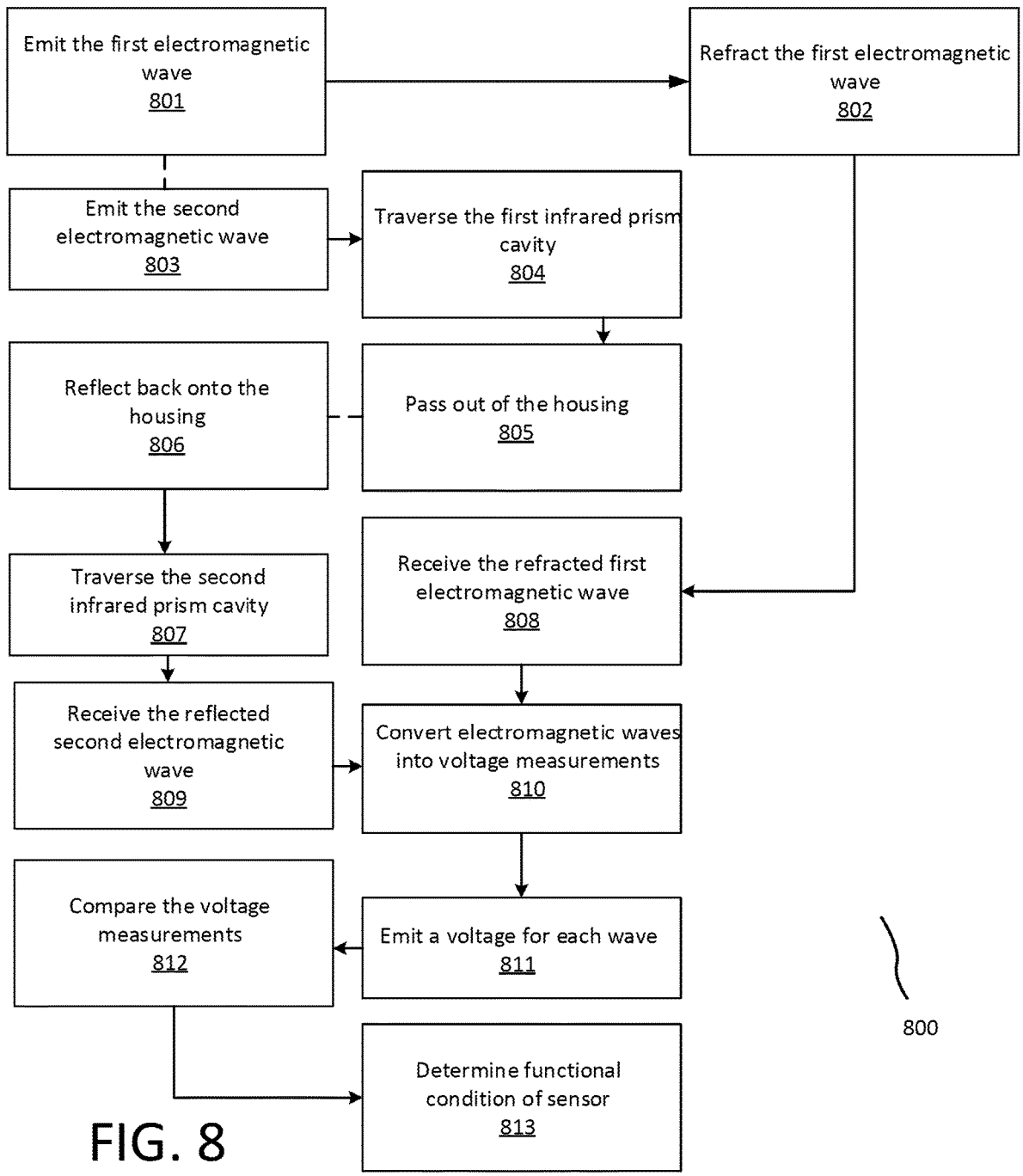
FIG. 8 illustrates a method for testing a sensor, in accordance with various embodiments.

Referring now to FIGS. 8, 6A and 6B, and with continued reference to FIG. 5C, a method for testing (Step 800) a sensor 300 is illustrated. As shown, the sensor housing 302 may further comprise an infrared light transmitter 616. In various embodiments, the infrared light transmitter 616 may be an infrared light emitter. In various embodiments, the infrared light transmitter 616 may be located proximate the first infrared prism cavity 309 of the housing 302. In various embodiments, the infrared light transmitter 616 may be configured to emit electromagnetic waves, including infrared light, and the like. For example, the infrared light transmitter 616 may be configured to emit (Step 801) the first electromagnetic wave 618 that is eventually refracted (Step 802) by the microprism 413 and traverses the first infrared prism cavity 309 to the second infrared prism cavity 311 via the microprism 413 disposed within the slit mount 414.

In various embodiments, infrared light transmitter 616 may be further configured to emit (Step 803) a second electromagnetic wave 620. In various embodiments, the second electromagnetic wave 620 may traverse (Step 804) the first infrared prism cavity 309 and pass out (Step 805) of the sensor housing 302 through the first infrared prism lens 308. If an object, such as a pallet, ULD, or the like is in proximity to the sensor housing 302, the second electromagnetic wave 620 may reflect (Step 806) off the object and back onto the housing 302. For example, the reflected second electromagnetic wave 620 may be reflected back onto the second infrared prism lens 310 of the housing 302. In various embodiments, the reflected second electromagnetic wave 620 may pass through the second infrared prism lens 310 and traverse (Step 807) the second infrared prism cavity 311. In various embodiments, the housing 302 may further comprise an infrared light photoreceptor 622. The photoreceptor 622 may be located proximate the second infrared prism cavity 311 of the housing 302. In various embodiments, the photoreceptor 622 may be configured to receive (Step 808) the refracted first electromagnetic wave 618 after it traverses the microprism 413.

Similarly, in various embodiments, the photoreceptor 622 may be configured to receive (Step 809) the reflected second electromagnetic wave 620 after it passes through the second infrared prism lens 310. In various embodiments, the photoreceptor 622 is further configured to convert electromagnetic waves and other light waves it may receive into an analog or digital signal. In various embodiments, the photoreceptor 622 may be configured to convert (Step 810) electromagnetic waves and other light waves it may receive into voltage measurements. In various embodiments, the photoreceptor 622 may be configured to emit (Step 811) a voltage in accordance with the intensity of the electromagnetic waves it may receive.

In various embodiments, due to the microprism 413 in the housing 302, the photoreceptor 622 will always have a first electromagnetic wave 618 to measure if the infrared light transmitter 616 is functioning properly. In that case, the photoreceptor 622 may always have a voltage measurement to emit. If the voltage measurement is less than a predetermined threshold voltage value, or if there is no voltage measurement at all, then the infrared light transmitter 616 is considered degraded, and is either emitting electromagnetic waves that are less than the desired intensity, or is not emitting waves at all. Thus, the microprism 413 may enable the sensor 300 to constantly monitor its own functional condition.

In various embodiments, a system for testing sensor 300 functionality may comprise a microcontroller 621. In various embodiments, the microcontroller 621 may be configured to set a threshold voltage value associated with a preset electromagnetic wave. Since microprism's 613 indices and angles of refraction are known, the voltage values derived from electromagnetic waves refracted by the microprism 413 should be relatively constant. For example, when troubleshooting the sensor 300, the microcontroller 621 may be configured to direct the infrared light transmitter 616 to emit the first electromagnetic wave 618. In various embodiments, the photoreceptor 622 is configured to convert the first electromagnetic wave 618 into a first voltage measurement, which may be read by the microcontroller 621.

The microcontroller 621 may be further configured to compare (Step 812) the first voltage measurement to the threshold voltage value previously set by the microcontroller 621. In various embodiments, the microcontroller 621 may determine (Step 813) the functional condition of the sensor 300 based on the comparison. For example, if the first voltage measurement is below the threshold voltage value, then the microcontroller 621 may determine that the sensor 300 is not functioning properly. For example, the microcontroller 621 may determine that the sensor 300 is in a Fault Condition, rather than a Normal Condition or Degraded Condition. Troubleshooting the sensor 300 in this way may be beneficial since it lowers the frequency repairs to cargo deck structural components, such as the PDUs, which can be costly and time-consuming. Moreover, ensuring sensor functionality may be useful for both flight safety and efficiency.

Similarly, in various embodiments, such as during normal operation, the microcontroller 621 may be configured to direct the infrared light transmitter 616 to emit a second electromagnetic wave 620. The reflected second light wave 620 may be received by the photoreceptor 622 and converted by the photoreceptor 622 into a second voltage measurement that is read by the microcontroller 621. In various embodiments, the microcontroller 621 may subtract the first voltage measurement of the first electromagnetic wave 618 from the second voltage measurement of the second electromagnetic wave 620 to form a third voltage measurement. In various embodiments, the microcontroller 621 may compare the third voltage measurement to the threshold voltage value and determine object proximity to the sensor 300 if the third voltage measurement is greater than the threshold voltage value. This information can then be relayed by the microcontroller 621 to the cockpit, the cargo handling system operator, the Cargo Maintenance Display Unit (CMDU), or the like.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C.

Systems, methods, and apparatus are provided herein. In the detailed description herein, references to "various embodiments", "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is intended to invoke 35 U.S.C. 112(f) unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A sensor, the sensor comprising:
    a housing, wherein the housing comprises a rim defining a first infrared prism cavity and a second infrared prism cavity, wherein the housing further comprises a slit mount defining a slit mount cavity, wherein the slit mount is disposed between the first infrared prism cavity and the second infrared prism cavity;
    an infrared light emitter located proximate the first infrared prism cavity of the housing; and
    a microprism disposed within the slit mount,
    wherein the microprism is configured to refract a first electromagnetic wave emitted from the infrared light emitter, wherein the first electromagnetic wave traverses the first infrared prism cavity to the second infrared prism cavity via the microprism.

2. The sensor of claim 1, further comprising an infrared light photoreceptor located proximate the second infrared prism cavity of the housing, wherein the infrared light photoreceptor is configured to receive the refracted first electromagnetic wave, wherein the infrared light photoreceptor is configured to convert the first electromagnetic wave received by the infrared light photoreceptor into a first voltage measurement.

3. The sensor of claim 2, further comprising a microcontroller, wherein the microcontroller is configured to set a predetermined threshold voltage value, command the infrared light emitter to emit the first electromagnetic wave, wherein the microcontroller is further configured to command the infrared light photoreceptor to receive the first electromagnetic wave, convert the first electromagnetic wave into the first voltage measurement, and send the first voltage measurement to the microcontroller, wherein the microcontroller is further configured to receive the first voltage measurement from the infrared light photoreceptor, read the first voltage measurement, compare the first voltage measurement to the threshold voltage value set by the microcontroller, and determine sensor failure if the first voltage measurement is below the threshold voltage value.

4. The sensor of claim 2, further comprising a first infrared prism lens disposed within the first infrared prism cavity and a second infrared prism lens disposed within the second infrared prism cavity, wherein the first infrared prism lens and the second infrared prism lens are configured to permit electromagnetic waves to pass therethrough.

5. The sensor of claim 4, wherein the infrared light emitter is configured to emit a second electromagnetic wave.

6. The sensor of claim 5, wherein the second electromagnetic wave traverses the first infrared prism cavity and passes out of the sensor housing through the first infrared prism lens, wherein the second electromagnetic wave reflects off an object and back onto the sensor.

7. The sensor of claim 6, wherein the reflected second electromagnetic wave passes through the second infrared prism lens, traverses the second infrared prism cavity of the housing, and is received by the infrared light photoreceptor.

8. The sensor of claim 7, wherein the infrared light photoreceptor is configured to convert the second electromagnetic wave received by the infrared light photoreceptor into a second voltage measurement.

9. The sensor of claim 8, wherein the second voltage measurement is a variable value.

10. The sensor of claim 1, wherein the microprism comprises an apex angle $\alpha$.

11. The sensor of claim 10, wherein the microprism further comprises a first face and a second face, wherein the first electromagnetic wave is configured to enter the microprism through the first face and exit the microprism through the second face.

12. The sensor of claim 11, wherein the first face is configured to refract the first electromagnetic wave at a first refraction region, wherein the first refraction region comprises an index of refraction $\theta_0$, wherein the microprism is further configured to refract the first electromagnetic wave at a second refraction region located between the first face and the second face, wherein the second refraction region comprises an index of refraction $\theta_1$, wherein the second face is configured to refract the first electromagnetic wave at a third refraction region, wherein the third refraction region comprises an index of refraction $\theta_2$, wherein the first electromagnetic wave comprises an angle of refraction $\theta'_0$ at the second refraction region and an angle of refraction $\theta'_1$ at the third refraction region.

13. The sensor of claim 12, wherein the microprism is an acrylic sheet.

14. The sensor of claim 1, wherein the housing further comprises a first housing orifice located distal to a second housing orifice.

15. The sensor of claim 1, wherein the first electromagnetic wave is infrared light.

16. The sensor of claim 4, wherein the microprism, the first infrared prism lens, and the second infrared prism lens are molded in the housing, wherein the first infrared prism lens is larger than the second infrared prism lens.

17. A method for testing a sensor, the method comprising:
setting a predetermined threshold voltage value by a microcontroller of the sensor, the sensor further comprising:
  a housing, wherein the housing comprises a rim defining a first infrared prism cavity and a second infrared prism cavity, wherein the housing further comprises a slit mount defining a slit mount cavity, wherein the slit mount is disposed between the first infrared prism cavity and the second infrared prism cavity, wherein the slit mount is oriented between the first infrared prism cavity and the second infrared prism cavity;
  an infrared light emitter located proximate the first infrared prism cavity of the housing;
  an infrared light photoreceptor located proximate the second infrared prism cavity of the housing; and
  a microprism disposed within the slit mount defining the slit mount cavity;
commanding, by the microcontroller, the infrared light emitter to emit a first electromagnetic wave through the first infrared prism cavity of the sensor housing, wherein the first electromagnetic wave traverses the first infrared prism cavity to the second infrared prism cavity via the microprism, wherein the microprism is configured to refract the first electromagnetic wave emitted from the infrared light emitter, wherein the microcontroller is configured to command the infrared light photoreceptor to receive the refracted first electromagnetic wave, convert the first electromagnetic wave into a first voltage measurement, and send the first voltage measurement to the microcontroller;
reading, by the microcontroller, the first voltage measurement;
comparing, by the microcontroller, the first voltage measurement to the threshold voltage value set by the microcontroller; and
determining, by the microcontroller, sensor failure if the first voltage measurement is below the threshold voltage value.

18. The method of claim 17, further comprising:
commanding, by the microcontroller, the infrared light emitter to emit a second electromagnetic wave through the first infrared prism cavity of the sensor housing, the housing further comprising:
  a first infrared prism lens disposed within the first infrared prism cavity; and
  a second infrared prism lens disposed within the second infrared prism cavity, wherein the first infrared prism lens and the second infrared prism lens are configured to permit infrared light to pass therethrough, wherein the second electromagnetic wave traverses the first infrared prism cavity and passes out of the sensor housing through the first infrared prism lens, wherein the second electromagnetic wave reflects back onto the sensor, wherein the reflected second electromagnetic wave passes through the second infrared prism lens and traverses the second infrared prism cavity of the housing, wherein the microcontroller is configured to command the infrared light photoreceptor to receive the reflected second electromagnetic wave, convert the second electromagnetic wave into a second voltage measurement, and send the second voltage measurement to the microcontroller;

and reading, by the microcontroller, the second voltage measurement.

19. The method of claim 18, further comprising subtracting, by the microcontroller, the first voltage measurement of the first electromagnetic wave from the second voltage measurement of the second electromagnetic wave to form a third voltage measurement.

20. The method of claim 19, further comprising:

comparing, by the microcontroller, the third voltage measurement to the threshold voltage value; and determining, by the microcontroller, object proximity to the sensor if the third voltage measurement is greater than the threshold voltage value.

* * * * *